United States Patent [19]

Sutton

[11] 4,007,400
[45] Feb. 8, 1977

[54] DEFLECTION SYSTEM FOR CATHODE RAY OSCILLOSCOPE

[76] Inventor: John F. Sutton, 4412 Greenwood Road, Beltsville, Md. 20705

[22] Filed: Mar. 11, 1975

[21] Appl. No.: 557,439

[52] U.S. Cl. .............................. 315/364; 328/186
[51] Int. Cl.² .................... H01J 29/70; H01J 29/72
[58] Field of Search ................ 315/365, 367, 364; 343/5 EM; 307/227; 331/178, 179; 328/186

[56] References Cited

UNITED STATES PATENTS

| | | | |
|---|---|---|---|
| 3,364,437 | 1/1968 | Loposer et al. | 331/178 |
| 3,378,720 | 4/1968 | Duerr et al. | 315/367 |
| 3,466,553 | 9/1969 | Stuckert | 328/186 |
| 3,701,954 | 10/1972 | Seminatore et al. | 328/186 |
| 3,758,825 | 9/1973 | Kapers, Jr. | 315/367 |

Primary Examiner—T.H. Tubbesing
Assistant Examiner—T. M. Blum
Attorney, Agent, or Firm—Ronald F. Sandler; Gary F. Grafel; John R. Manning

[57] ABSTRACT

A cathode ray oscilloscope deflection system selectively displays an integral number of cycles of a periodic or quasi-periodic input signal, regardless of the frequency of the signal. A wide band phase locked loop, synchronized to the input signal, generates pulses at a pulse repetition rate that is an integral multiple of the frequency of the input signal. A ripple counter converts the pulses into a staircase, x-axis deflection signal having a period equal to the duration of the number of cycles of the input signal selected for display and a predetermined maximum amplitude so that the x-axis of the scope is always swept the same distance regardless of the frequency of the input signal. The number of cycles displayed is determined by the repetition rate of the phase locked loop pulses relative to the frequency of the input signal. The repetition rate of the loop pulses is controlled by: (a) a first binary divider for controlling which of the fundamental or integral submultiple frequency of the input signal to which the phase locked loop is synchronized, and/or (b) a second binary divider circuit for controlling the pulse repetition rate of feedback pulses in the phase locked loop. Frequency or period of the input signal is displayed by a digital frequency or period meter that monitors the loop pulses.

7 Claims, 8 Drawing Figures

DEFLECTION SYSTEM FOR CATHODE RAY OSCILLOSCOPE

ORIGIN OF THE INVENTION

The invention described herein was made by an employee of the U.S. Government and may be manufactured and used by or for the Government for governmental purposes without the payment of any royalties thereon or therefor.

FIELD OF THE INVENTION

The present invention relates generally to deflection systems and more particularly to a cathode ray tube deflection system for automatically displaying a selected integral number of cycles of a periodic or quasi-periodic signal regardless of the frequency of the signal.

BACKGROUND OF THE INVENTION

Essentially all commercially available cathode ray oscilloscopes include time base sweep circuits designed such that an electron beam is swept linearly across the screen of a cathode ray tube at a preselected rate. Preselection is performed via front panel switches. The selectable sweep rates typically range from seconds/centimeter to tenths of a microsecond/centimeter, usually in a 1-2-5-10 sequence.

Observation of a periodic or quasi-periodic waveform on a standard cathode ray oscilloscope is usually accomplished by manual selection of an appropriate sweep rate, adjustment of the sweep trigger controls and vertical amplifier attenuator setting. The waveform is observed directly on the cathode ray tube while the period or frequency of the waveform may be determined by employing a screen reticle on the face of the cathode ray tube and a calibrated deflection rate switch setting.

While satisfactory for many applications, this observation and measurement technique has several disadvantages. For example, measurement of frequency of a displayed signal involves some mental calculation. One cycle of the signal is first observed on the screen of the cathode ray tube. Using the screen reticle, the period is determined from the deflection rate switch setting. Then the period is arithmetically inverted to provide frequency. This technique typically results in a 5-10% error.

As another disadvantage, at any given deflection rate setting, the number of cycles displayed is a function of the frequency of the input signal. As the frequency of the input signal changes, the number of cycles displayed on the cathode ray tube of the oscilloscope changes proportionally. When the frequency of the input signal is substantially higher than the deflection rate of the oscilloscope, a large number of cycles is displayed on the screen, making visual analysis impracticable. To display a small number of cycles of the signal across the entire screen, the deflection rate of the oscilloscope must be manually increased by means of the deflection rate control.

It is often desirable to provide a display of a predetermined number of cycles of an input signal independent of the frequency thereof. Systems have been provided in the prior art for this purpose. The systems of which I am aware, although generally somewhat satisfactory, are quite complex and not practical for general applications requiring low cost. This is because several stages of signal processing are utilized for automatically synchronizing the deflection rate of the deflection signal to the frequency of the input signal. In addition, the systems include no means for displaying the frequency or period of the input signal.

OBJECTS OF THE INVENTION

Accordingly, one object of the present invention is to provide a new and improved deflection system.

A further object of the invention is to provide a new and improved sweep circuit for deriving a constant maximum amplitude output signal of variable duration dependent upon the period of an input signal.

Another object of the present invention is to provide a new and improved deflection system for automatically displaying a predetermined integral number of cycles of an input signal, independent of the frequency of the signal.

Another object of the present invention is to provide a new and improved cathode ray tube deflection system for automatically displaying a predetermined number of cycles of an input signal and displaying the frequency or period thereof.

Still another object of the present invention is to provide a new and improved deflection system that utilizes a phase locked loop and ripple counter to generate a staircase deflection waveform for displaying a predetermined integral number of cycles of an input signal.

An additional object of the present invention is to provide an economical and easy to use deflection system for a signal display instrument, such as a cathode ray tube.

BRIEF DESCRIPTION OF THE INVENTION

In accordance with the present invention, display of a predetermined integral number of cycles of an input signal, independent of frequency, is attained by the provision of a wide band phase locked loop circuit which is synchronized to the input signal and controls a frequency divider that controls the slope of a constant maximum amplitude CRT sweep. Preferably, the frequency divider comprises a ripple counter for generating a staircase deflection signal. The staircase signal, when applied to a pair of deflection plates in a cathode ray tube, causes an electron beam to sweep the same distance across the screen of the tube in equal increments, which may be smoothed by a filter.

The input signal is applied to a conventional trigger amplifier that generates trigger pulses responsive to a selected recurring portion of the input signal. The phase locked loop, synchronized to the trigger pulses, generates pulses having a repetition rate equal to an integral multiple of the repetition rate of the trigger pulses. The loop includes a phase detector that generates an error signal proportional to the phase difference between the trigger pulses and the pulses generated by a voltage controlled oscillator. The pulses generated by the oscillator are fed back to the phase detector through a binary divider chain. Any error signal is supplied to a feedback integrator that derives a control for the voltage controlled oscillator in a direction tending to reduce the error signal to zero. For a divide-by-M divider chain, the repetition rate of the pulses generated by the oscillator in steady state is equal to M × F, where F is the repetition rate of the trigger pulses. For a typical input signal to be displayed which usually has a relatively low frequency, the divider chain preferably includes at least five binary divide-by-two divider stages to cause the oscillator to operate at a pulse repetition rate of at least 32F. Increasing the oscillator frequency by a factor of at least 32 decreases the size of individual steps that form the sweep signal to reduce granularity in the display. Also, accuracy of the feedback integrator is increased by supplying pulses to it at a relatively rapid repetition rate of at least 32F.

Outputs of the binary divider stages are connected to a D—A converter, such as a weighted ladder circuit or R–2R ladder network, and summing amplifier for operation as a ripple counter. The ripple counter converts the oscillator pulses into a repetitive, variable frequency staircase signal that is synchronized to the input signal. The staircase signal, which may be smoothed by a filter having an adjustable frequency characteristic to form a sawtooth signal, has a constant maximum amplitude, a period equal to the duration of the selected number of cycles of the input signal, and a slope inversely proportional to the period thereof. The sawtooth voltage is applied to the x-axis of the scope so that the length of the scope sweep is constant and independent of the frequency of the input signal. Thereby, an integral, predetermined number of cycles of the input signal is displayed on the scope regardless of the frequency of the input signal.

For example, for display of a single cycle of the input signal, the voltage controlled oscillator is driven by the divide-by-M divider chain to generate M pulses per cycle of the input signal. Accordingly, one cycle of the staircase waveform having a period equal to the period of the input signal is generated for each M pulses generated by the oscillator.

For display of plural integral cycles of the input signal, the period of the staircase waveform is increased so that the period of one cycle thereof equals the duration of the selected number of cycles of the input signal. In order to increase the period of the staircase, the repetition rate of the loop generated pulses relative to the frequency of the input signal is divided by an integer equal to the number of cycles to be displayed. Since each staircase is comprised of M loop generated pulses, independent of the repetition rate of the pulses, the period of the staircase is multiplied by the integer.

According to one preferred embodiment, a binary divider circuit is provided between the trigger amplifier and the phase locked loop to divide the repetition rate of the trigger pulses. A switch controls the number of divider stages effectively connected in circuit to vary the number of displayed integral cycles of the input signal. In another embodiment, in order to divide the pulse repetition rate of the oscillator, the pulse repetition rate of the feedback pulses in the phase locked loop relative to the frequency of the input signal is divided by the divider chain incorporated in the ripple counter. The repetition rate of the feedback pulses is selectable with an output tap at each stage of the divider chain.

Frequency or period of the input signal is accurately monitored by a digital frequency or period counter connected to the output of the voltage controlled oscillator.

The above and still further objects, features and advantages of the present invention will become apparent upon consideration of the following detailed description of several specific embodiments thereof, especially when taken in conjunction with the accompanying drawing.

DETAILED DESCRIPTION OF THE DRAWING

Figure 1:
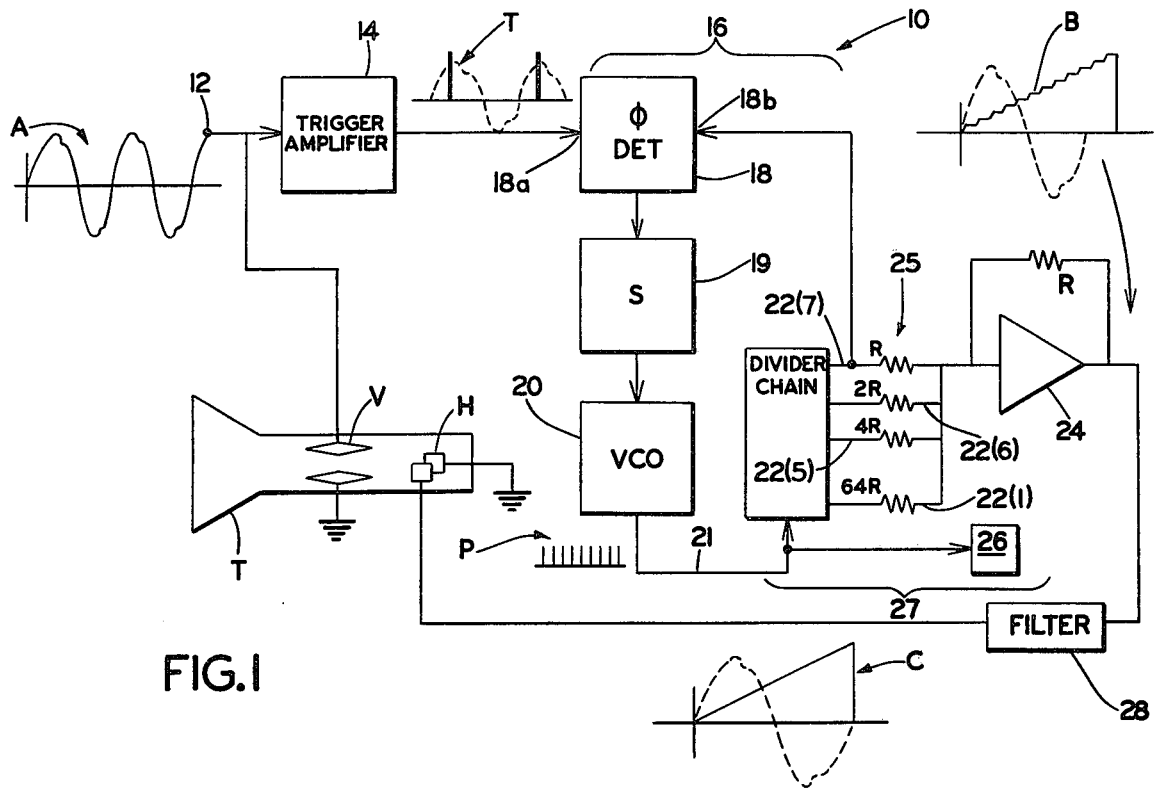
FIG. 1 is a block diagram of one embodiment of the present invention.

With reference to FIG. 1, there is illustrated a block diagram of one embodiment of an automatic deflection system 10 according to the present invention. An input signal A having a waveform to be displayed is applied to input terminal 12 of system 10. The input signal A is also applied to the vertical deflection plates V of a cathode ray tube T. According to the invention, system 10 includes novel circuitry for generating a sawtooth deflection signal C having a period directly proportional to the period of signal A, a slope having a magnitude inversely proportional to the period of signal A and a constant maximum amplitude. Signal C is applied to horizontal deflection plates H to display a predetermined, integral number of cycles of input signal A independent of the frequency of signal A. Vertical and horizontal deflection amplifiers (not shown) are respectively provided between system 10 and plates V and H for buffering and amplification. Retrace blanking circuitry has been omitted from FIG. 1 for simplicity; however, such circuitry could be used without affecting the operation of the present invention. System 10 includes a trigger amplifier 14 that generates a pulse T in response to a preselected recurring portion of each cycle of input signal A. Trigger amplifier 14 is standard and is used in conventional laboratory oscilloscopes such as the Techtronix Model 465 oscilloscope to generate a pulse in response to a preselected amplitude or slope of either the positive or negative portion of each cycle of signal A.

Trigger amplifier 14 supplies trigger pulses T to input 18a of phase locked loop 16. Phase locked loop 16 generates pulses, synchronized to trigger pulses, that are converted by ripple counter 27 to staircase signal B that has the same period and amplitude variation as sawtooth sweep deflection signal C.

Phase locked loop 16 comprises phase detector 18, filter 19, voltage controlled oscillator (VCO) 20, and binary divider chain 22. The pulse repetition rate of pulses P generated by VCO 20 is controlled by the output of phase detector 18 which is responsive to the phase difference between signals supplied respectively to the inputs 18a and 18b thereof. An error signal generated by phase detector 18, indicative of the phase difference between the output of VCO 20 and input signal A, is filtered in filter 19 which derives a signal that is applied to VCO 20 to change the pulse repetition rate of pulses P in a direction tending to reduce the error to zero. The output of VCO 20 is fed back to input 18b of phase detector 18 via negative feedback path 21 including divider chain 22. At steady state, the pulse repetition rate of pulse P generated by VCO 20 is MF, where F is the pulse repetition rate of trigger pulses T and divider chain 22 is a divide-by-M divider chain. Thereby, the number of pulses derived from divider chain 22 is the same for each cycle of waveform A, regardless of the frequency of the waveform.

Preferably, phase locked loop 16, shown schematically in FIG. 1, is a wide band phase locked loop utilizing a sample and hold phase detector for operating over at least a five decade frequency band without band switching. Such a phase locked loop is disclosed in an article by Schowe, Jr., Electronic Design 18, Sept. 1, 1974, pp. 112–116.

Preferably, divider chain 22 includes at least five binary divider stages to divide by an integer of at least 32 so that the length and height of each of the steps of waveform B are relatively small to reduce granularity in the horizontal sweep of tube T. In the preferred embodiment, binary divider chain 22 contains seven divide-by-two binary divider circuits connected in tandem. The divider chain 22 includes seven outputs 22(1) . . . 22(7) respectively. Seven divider circuits are preferred because integrated circuits containing seven such circuits are presently commercially available; however, it is understood that other numbers of binary divider circuits could be utilized in counter 22.

The output of the last stage 22(7) of divider chain 22 supplies a binary pulse for each $2^7$ (128) binary pulses supplied to the input of the chain. As mentioned, the output of the last stage 22(7) is supplied to input terminal 18b of phase detector 18, the other input terminal 18a receiving trigger pulses T. Accordingly, as described in the Schowe, Jr. article, supra, VCO 20, synchronized to trigger pulses T, oscillates at a pulse repetition rate that is 128 times the repetition rate of pulses T.

The output of each stage 22(1) . . . 22(7) of divider chain 22 is supplied to summing amplifier 24 through a weighted ladder circuit 25, as in FIG. 1, or a conventional, R–2R ladder circuit (not shown). Summing amplifier 24, ladder circuit 25, and divider chain 22 form a conventional ripple counter circuit 27 that generates a recurring 128 step staircase signal B in response to pulses P generated by VCO 20.

Divider chain 22 generates an increasing sequence of binary numbers at the outputs of stages 22(1) . . . 22(7) in response to pulses P supplied thereto. The binary output at stages 22(1) . . . 22(7) of divider chain 22 resets to zero after the chain becomes fully loaded, i.e., following the 128th pulse supplied to the chain. The output of divider chain is converted by ladder circuit 25 and summing amplifier 24 to a repetitive staircase waveform having 128 equal amplitude steps/cycle. To derive the equal amplitude steps and enable the total amplitude variation of waveform B to be constant for each 128 pulses derived from oscillator 20, ladder circuit 25 comprises a sequence of resistors 25, a different one of which is connected to a different one of the stages of counter 22. The values of resistors 25 are selected in accordance with $R2^N$ [where N = the complement of the stage number; i.e., the resistor connected to stages 22(1) and 22(2) respectively have values of 64R and 32R]. Alternatively, a conventional R–2R ladder network could be employed. The steps of staircase signal B may be smoothed by filter 28 to provide sawtooth signal C that is synchronized to input signal A and has a period equal to that of input signal A. Preferably, filter 28 has frequency characteristic that is adjustable by known techniques.

Figure 2A:
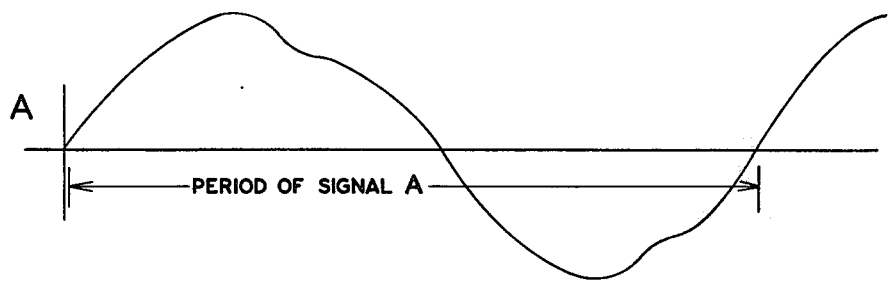
FIGS. 2a–2e are illustrations of typical waveforms generated by the system of FIG. 1.
Figure 2B:
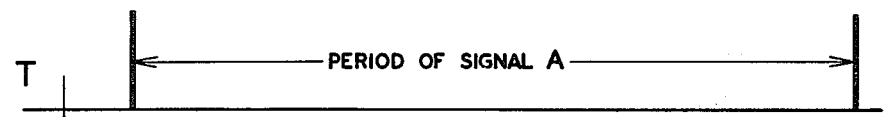
Figure 2C:
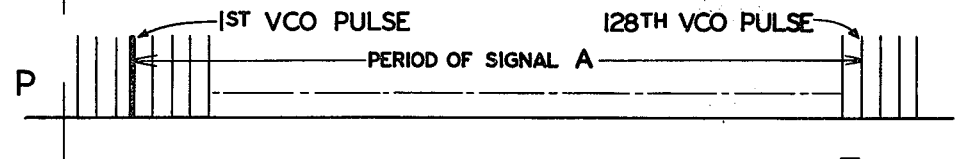
Figure 2D:
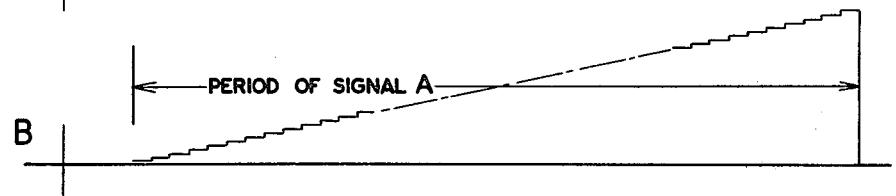

The relationship between signals A, T, P, B and C will become more clear referring to FIGS. 2a–2e. Generation by trigger amplifier 14 of trigger pulses T (FIG. 2b) is typically controllable from the front panel of a conventional triggered oscilloscope and is shown for purpose of illustration as being responsive to an arbitrarily chosen early portion of each cycle of input signal A (FIG. 2a). Pulses P (FIG. 2c), generated by VCO 20, are synchronized to trigger pulses T at a repetition rate that is 128 times that of the trigger pulses. As seen, 128 pulses P extend over one cycle of input signal A and each cycle of staircase waveform B (FIG. 2d), synchronized to trigger pulses T, has a period equal to that of input signal A. Each cycle of staircase B contains 128 steps and has a constant maximum amplitude that is independent of the frequency of input signal A. Sawtooth waveform C (FIG. 2e) is similar to staircase waveform B with the step discontinuities smoothed by filter 28.

Figure 2E:
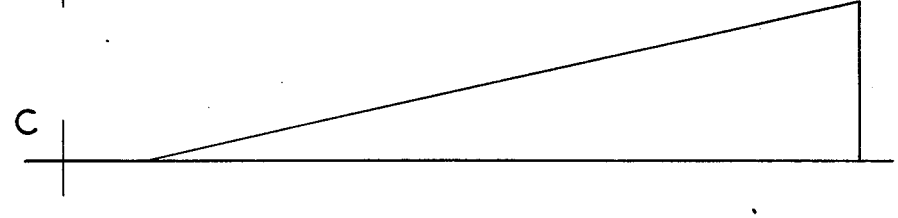

Since the period of sawtooth deflection signal C is equal to the period of input signal A as seen respectively in FIGS. 2e and 2a, one integral cycle of signal A applied to vertical deflection plates V is displayed on the screen of cathode ray tube T of FIG. 1. As mentioned, deflection is synchronized to trigger pulses T and may be selectively initiated at any portion of the input signal by means of an adjustable threshold control (not shown) in conventional trigger amplifier 14.

The single cycle display is independent of the frequency of input signal A. For example, an increase in the frequency of the input signal A produces corresponding increases respectively in the repetition rate of VCO 20 and in the slope of the constant maximum amplitude staircase B. Thus, according to the present invention, deflection rate (slope of staircase B) is automatically controlled to track with the frequency of the input signal A and no front panel selector switches need be operated.

The frequency of input signal A, being directly proportional to the pulse repetition rate of VCO 20, is measured with a conventional digital frequency meter 26 connected to the output of the VCO (FIG. 1). In order to display input frequency directly, meter 26 must be calibrated according to the number of binary divider stages incorporated in divider chain 22. In the present example, where VCO 20 oscillates at a pulse repetition rate that is 128 times the frequency of input signal A, meter 26 is calibrated to display the pulse repetition rate of the VCO divided by 128. If desired, an appropriately calibrated period meter can be incorporated in a similar manner.

The automatic sweep system of FIG. 1 can be modified to provide selective stable display of plural integral cycles of input signal A by dividing the pulse repetition rate of VCO 20 relative to the frequency of signal A. In the preferred embodiments this is effected with two approaches: (a) dividing the pulse repetition rate of trigger pulses T, and/or (b) dividing the pulse repetition rate of feedback pulses in phase locked loop 16. Obviously, meter 26 must be calibrated according to the number of cycles selected for display. This can be provided with conventional ganged switching techniques.

Figure 3:
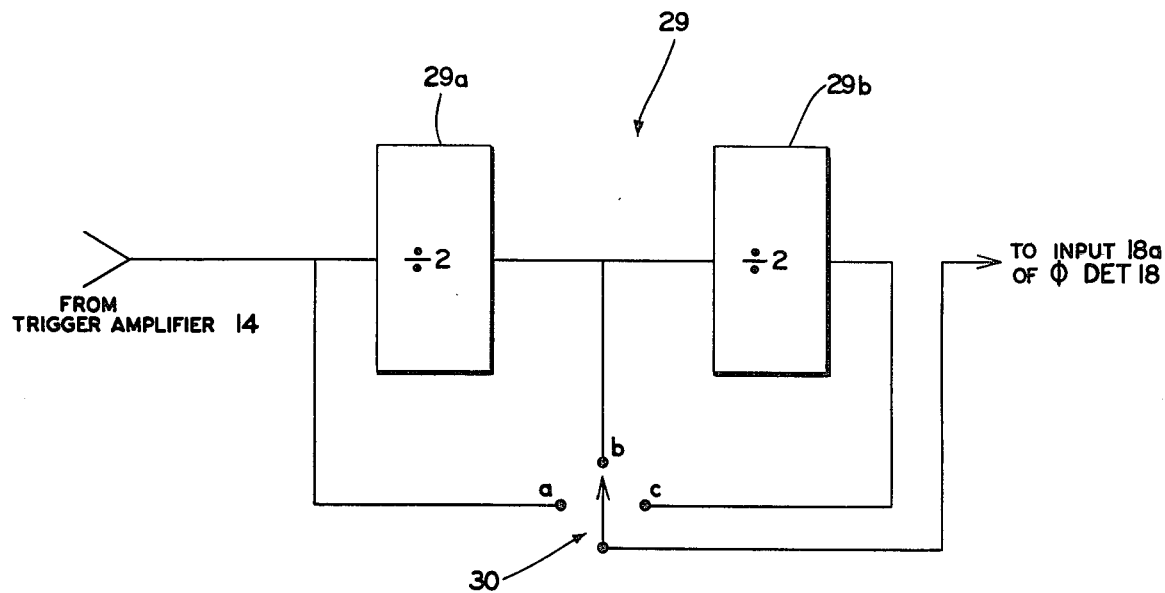
FIG. 3 is a partial block diagram of another embodiment of the present invention.

Referring to FIG. 3, binary divider circuit 29 is incorporated into automatic deflection system 10 of FIG. 1 for selectively dividing the pulse repetition rate of trigger pulses T in accordance with approach (a) above. Divider circuit 29 is connected between trigger amplifier 14 and the input of phase locked loop 16. A selector switch 30 is provided for manually selecting the number of cycles of input signal A to be displayed. The common terminal of switch 30 is connected to input terminal 18a of the loop 16, and switch terminals 30a, 30b and 30c are respectively connected to the output of (1) trigger amplifier 14, (2) first divide-by-two divider circuit 29a and (3) second divide-by-two divider circuit 29b.

When the common terminal of switch 30 is connected to switch terminal 30a, input 18a is connected directly to the output of trigger amplifier 14 whereby operation of system 10 is identical to that of FIG. 1 for display of one cycle of input signal A.

When the common terminal of switch 30 is connected to switch terminal 30b, at the output of divider 29a, the repetition rate of trigger pulses T is divided by a factor of two to be synchronized to alternate cycles of input signal A, rather than to each cycle thereof. Accordingly, the staircase waveform B generated by ripple counter 27 has a period equal to the duration of two cycles of input signal A. Resultant sawtooth C is supplied to deflection plates H of the cathode ray tube T for displaying two cycles of input signal A.

Similarly, when the common terminal of switch 30 is connected to switch terminal 30c, at the output of divider 29b, the pulse repetition rate of trigger pulses T is divided by a factor of four and the resultant sawtooth C is supplied to plates H for displaying four cycles of input signal A.

Although a pair of divide-by-two divider circuits 29a and 29b are illustrated in FIG. 2a, by way of example, whereby selectively one, two or four cycles are displayed, it is understood that additional divider circuits can be utilized for displaying larger numbers of cycles of input signal A on the screen of cathode ray tube T. For example, binary divider circuit 29 can be replaced by a commercially available programmable divide-by-N divider circuit such as the R.C.A. CD 4059 COSMOS integrated circuit for selectively displaying any number of cycles of the input signal up to 9,999.

Figure 4:
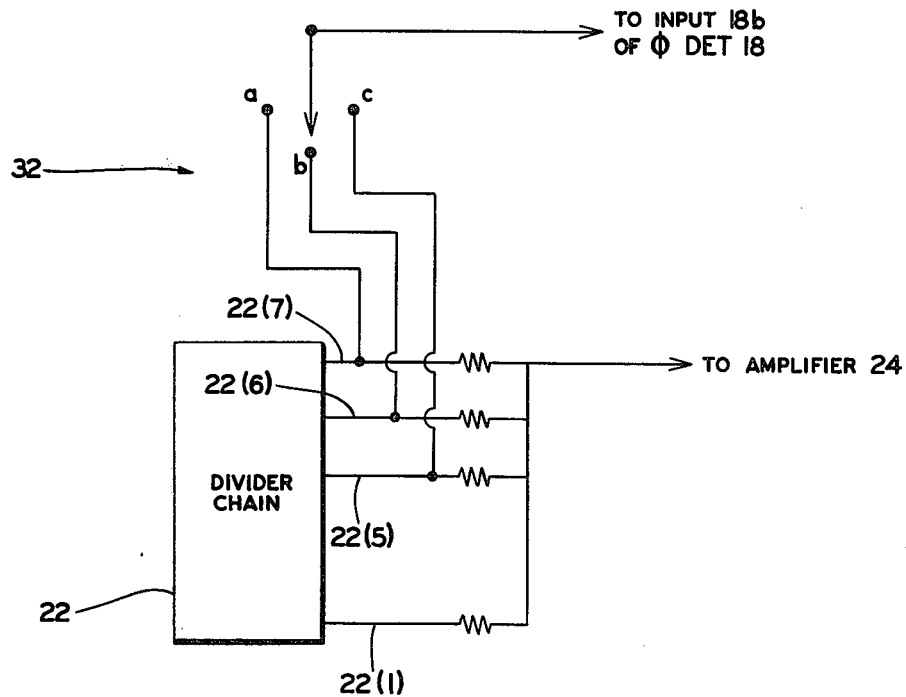
FIG. 4 is a partial block diagram of another embodiment of the present invention.

Referring to FIG. 4, the number of cycles of input signal A to be displayed is selectable by controlling the pulse repetition rate of the feedback pulses in phase locked loop 16 for control of the pulse repetition rate of VCO 20 in accordance with approach (b) above. Switch 32 includes a common terminal connected to input 18b of phase detector 18 and terminals 32a, 32b and 32c connected respectively to the last three outputs 22(7), 22(6) and 22(5) of divider chain 22. Switch 32 selectively controls the repetition rate of the feedback pulses supplied to input terminal 18b of phase detector 18 which determines the pulse repetition rate of VCO 20 relative to trigger pulses T.

For example, when the common terminal of switch 32 is connected to switch terminal 30a, feedback pulses to phase detector 18 are supplied from the output of the last stage 22(7) of divider chain 22 (divide-by-128 output), to provide operation identical to that of system 10 in FIG. 1 for single cycle display of input signal A. The period of staircase B, generated by ripple counter 27, in response to 128 pulses applied thereto, is equal to the period of input signal A.

When the common terminal of switch 32 is connected to switch terminal 32b, pulses from the output of stage 22(6) (divide by 64 output) of divider chain 22 are supplied to input terminal 18b of phase detector 18. Accordingly, VCO 22 oscillates at a pulse repetition rate that is 64 times the frequency of input signal A and the period of staircase B, generated by ripple counter 27, in response to 128 pulses supplied thereto, is equal to the duration of two cycles of input signal A for two cycle display.

Similarly, when the common terminal of switch 32 is connected to switch terminal 32c, pulses from the output of stage 22(5) (divide by 32 output) are supplied to phase detector 18 and staircase B has a duration equal to that of four cycles of input signal A for four cycle display.

Obviously, the dividing means of the embodiments of both FIGS. 3 and 4 can be incorporated in a single deflection system whereby the number of cycles of input signal A displayed on the cathode ray tube T is selectable both by switch 30 and switch 32. The provision of both selecting means is desirable for limiting the operating frequency of phase locked loop 16 to its rated operating frequency range irrespective of the frequency of input signal A. For example, for a very low frequency input signal A, in order to insure stable locking of phase locked loop 16 to trigger pulses T, it may be undesirable to decrease the repetion rate of the trigger pulses so that switch 32, controlling the repetition rate of VCO 20, is preferably operated to increase the number of cycles displayed. For a very high frequency input signal A, to avoid exceeding the maximum rated pulse repetition rate of VCO 20, it may be undesirable to increase the pulse repetition rate of the VCO so that the switch 30, controlling the repetition rate of trigger pulses T, is preferably operated to decrease the number of cycles displayed.

While there have been described and illustrated several specific embodiments of the invention, it will be clear that variations in the details of the embodiments specifically illustrated and described may be made. For example, an analog-to-digital converter may be provided in place of weighted ladder circuit 25 and amplifier 24 for converting the pulses generated by VCO 20 to a staircase. Also, the sawtooth may be used in conjunction with other display instruments utilizing a staircase or sawtooth time base, such as a strip chart recorder. In addition, it is understood that system 10 can be utilized in conjunction with a conventional triggered oscilloscope whereby the trigger amplifier 14 is supplied with the oscilloscope.

What is claimed is:
1. Automatic self-adjusting deflection system for displaying an integral number of cycles of an external input signal, independent of the frequency of the external input signal comprising:
an x-y display means having a first deflection input responsive to the external input signal for displaying the external input signal on said display means;
means synchronized to a particular recurring portion of the external input signal for generating trigger pulses;
phase locked loop means synchronized to the trigger pulses, including binary divider means for causing said loop means to generate pulses having a repetition rate that is an integral multiple of a repetition rate of the trigger pulses;
means for converting the loop generated pulses to a constant maximum amplitude and uniform staircase signal having a period equal to a duration of the displayed number of cycles of the external input signal, said converting means including a ripple counter having an R-2R ladder circuit connected to an output of said binary divider means; and
means for supplying said uniform staircase signal to a second deflection input of said display means.

2. The system of claim 1 wherein said phase locked loop means includes a digital, wide band phase locked loop.

3. The system of claim 1 including means for selecting the number of cycles of said external input signal to be displayed.

4. The system of claim 3 wherein said number of cycles selecting means includes means for dividing the pulse repetition rate of the trigger pulses relative to the frequency of the external input signal by an integer corresponding to the number of cycles selected for display.

5. The system of claim 3 wherein said number of cycle selecting means includes means for dividing the pulse repetition rate of feedback pulses in said phase locked loop means relative to the repetition rate of the trigger pulses by an integer corresponding to the number of cycles selected for display.

6. The system of claim 1 including filter means for smoothing step discontinuities in the staircase signal.

7. The system of claim 1 wherein said binary divider means is a divide-by-M binary divider for causing said loop to generate the pulses at the pulse repetition rate $M \times F$ where F is the repetition rate of the trigger pulses and M is an integer equal to or greater than 32.

* * * * *